United States Patent
Missiroli et al.

(10) Patent No.: US 8,456,914 B2
(45) Date of Patent: Jun. 4, 2013

(54) MEMORY DEVICE WITH MULTIPLE PLANES

(75) Inventors: Chiara Missiroli, Concorezzo (IT); Stefano Sivero, Capriate San Gervasio (IT); Nicola Maglione, Monza (IT)

(73) Assignee: Elpida Memory, Inc., Tokyo (JP)

( * ) Notice: Subject to any disclaimer, the term of this patent is extended or adjusted under 35 U.S.C. 154(b) by 281 days.

(21) Appl. No.: 13/041,907

(22) Filed: Mar. 7, 2011

(65) Prior Publication Data
US 2012/0230108 A1 Sep. 13, 2012

(51) Int. Cl.
*G11C 11/34* (2006.01)

(52) U.S. Cl.
USPC ..................... 365/185.18; 365/226

(58) Field of Classification Search
USPC .............................. 365/185.18, 226
See application file for complete search history.

(56) References Cited

U.S. PATENT DOCUMENTS 7,203,120 B2 * 4/2007 Tanzawa et al. ............. 365/226

\* cited by examiner

*Primary Examiner* — Son Dinh
*Assistant Examiner* — Nam Nguyen
(74) *Attorney, Agent, or Firm* — Morrison & Foerster LLP (57) ABSTRACT

Disclosed herein is a device that includes at least one selection/non-selection voltage receiving line, at least one word line operatively coupled to the selection/non-selection voltage receiving line, and a plurality of memory cells coupled to the word line; a selection voltage source line; and a selection voltage supply circuit comprising a first switch circuit and a first driver circuit driving the first switch circuit to be turned ON or OFF, the first switch circuit including a first node coupled to the selection voltage source line, a second node coupled to the selection/non-selection voltage receiving line of the first memory plane and a third node coupled to the selection/non-selection voltage receiving line of the second memory plane, and the first driver circuit being provided in common to the first and second memory planes.

20 Claims, 9 Drawing Sheets

MEMORY DEVICE WITH MULTIPLE PLANES

FIELD OF THE INVENTION

The present disclosure relates to a memory device with multiple planes.

The disclosure particularly, but not exclusively, relates to a memory with multiple plane of the NAND type and the following description is made with reference to this field of application for convenience of explanation only.

BACKGROUND OF THE INVENTION

In the last years the memory market has been characterized by an increasing interest in high density devices and technology scaling has become more and more aggressive, both for memory core and circuitry, especially for the memory devices of the NAND type. While the technology is continuously improving to reduce the memory size, new solutions are studied to reduce the area of the related analog circuitry, which is not exclusively dependent on technology, but mainly on the specifically adopted layouts and architectures.

At the same time, while devices are continuously shrinking, the performance requirements are getting more and more challenging.

One of the important features for NAND memories is the program throughput, which has been improved in the last years by increasing the page size, which is the amount of data that can be written or read in a parallel mode from a memory array.

Another relevant contribution is given by the multiple plane architecture and the related parallel plane page programming, which allows programming more pages at a time, each page belonging to a different matrix array.

However, in a memory device with multiple planes not only the row decoder circuitry but also all the voltage switches for the selected and unselected word lines are replicated for each plane and enabled only in the selected plane or planes, with an increasing of the complexity of the memory architecture as a whole.

The known configurations of memory devices with multiple planes thus require a high area and complicate the word line selection circuitry placement in the memory device floorplane.

SUMMARY OF THE INVENTION

One embodiment of the invention aims to provide a new structure for multiple plane memory devices able to reduce the area of the word line path circuitry, without affecting the single plane operation performances.

More in particular, the invention comprises the following supplemental and optional features, taken alone or in combination when needed.

According to an aspect of the disclosure, a device is provided, which comprises:
first and second planes each including selection/non-selection voltage receiving line, at least one word line operatively coupled to the selection/non-selection voltage receiving line, and a plurality of memory cells coupled to the word line;
a first voltage line;
a first local switch coupled between the first voltage line and the selection/non-selection voltage receiving line of the first plane, the first local switch being rendered conductive in response to a first control signal supplied to a first control node thereof;
a second local switch coupled between the first voltage line and the selection/non-selection voltage receiving line of the second plane, the second local switch being rendered conductive in response to a second control signal supplied to a second control node thereof;
a first global switch driver producing a first switch signal at an output node thereof; and
a signal line extending from the output node of the first global switch driver and branching to reach the first control node of the first local switch and the second control node of the second local switch, the first switch signal being transferred from the output node to the first and second control nodes as the first and second control signals.

In this way, the total number of global driver blocks, which are high voltage circuits is reduced, thus obtaining a great saving of area occupation of the memory device as a whole, such a memory device having also a decreased complexity, in terms of reduction of the difficulties tied to its silicon integration.

Another embodiment of the present disclosure is directed to an apparatus comprising:
first and second memory planes each comprising at least one selection/non-selection voltage receiving line, at least one word line operatively coupled to the selection/non-selection voltage receiving line, and a plurality of memory cells coupled to the word line;
a selection voltage source line; and
a selection voltage supply circuit comprising a first switch circuit and a first driver circuit driving the first switch circuit to be turned ON or OFF, the first switch circuit including a first node coupled to the selection voltage source line, a second node coupled to the selection/non-selection voltage receiving line of the first memory plane and a third node coupled to the selection/non-selection voltage receiving line of the second memory plane, and the first driver circuit being provided in common to the first and second memory planes.

Still another embodiment of the invention aims to provide a method comprising:
accessing a memory device, the memory device comprising,
  first and second planes each including a plurality of word lines connected to row decoders and a plurality of memory cells,
  a plurality of first local switches each provided to deliver, when selected, a first voltage to a line that feeds the row decoders of an associated one of the word lines of the first plane, and
  a plurality of second local switches each provided to deliver, when selected, the first voltage to a line that feeds the row decoders of an associated one of the word lines of the second plane; and
producing a set of selection signals in response to the accessing, each of the selection signals being supplied in common to an associated one of the first local switches and an associated one of the second local switches to select the associated ones of the first and second local switches, and one of the selection signals taking an active level to select the associated ones of the first and second local switches and remaining one or ones of the selection signals taking an inactive level to unselect remaining one or ones of the first and second local switches.

BRIEF DESCRIPTION OF THE DRAWINGS

The characteristics and advantages of the memory device, apparatus and method according to the disclosure will be apparent from the following description of embodiments thereof given by way of indicative and non limiting example with reference to the annexed drawings, in which FIG. 1 schematically shows a part of a NAND memory device matrix architecture according to respective embodiments of the present invention.

DETAILED DESCRIPTION OF THE EMBODIMENTS

Figure 1:
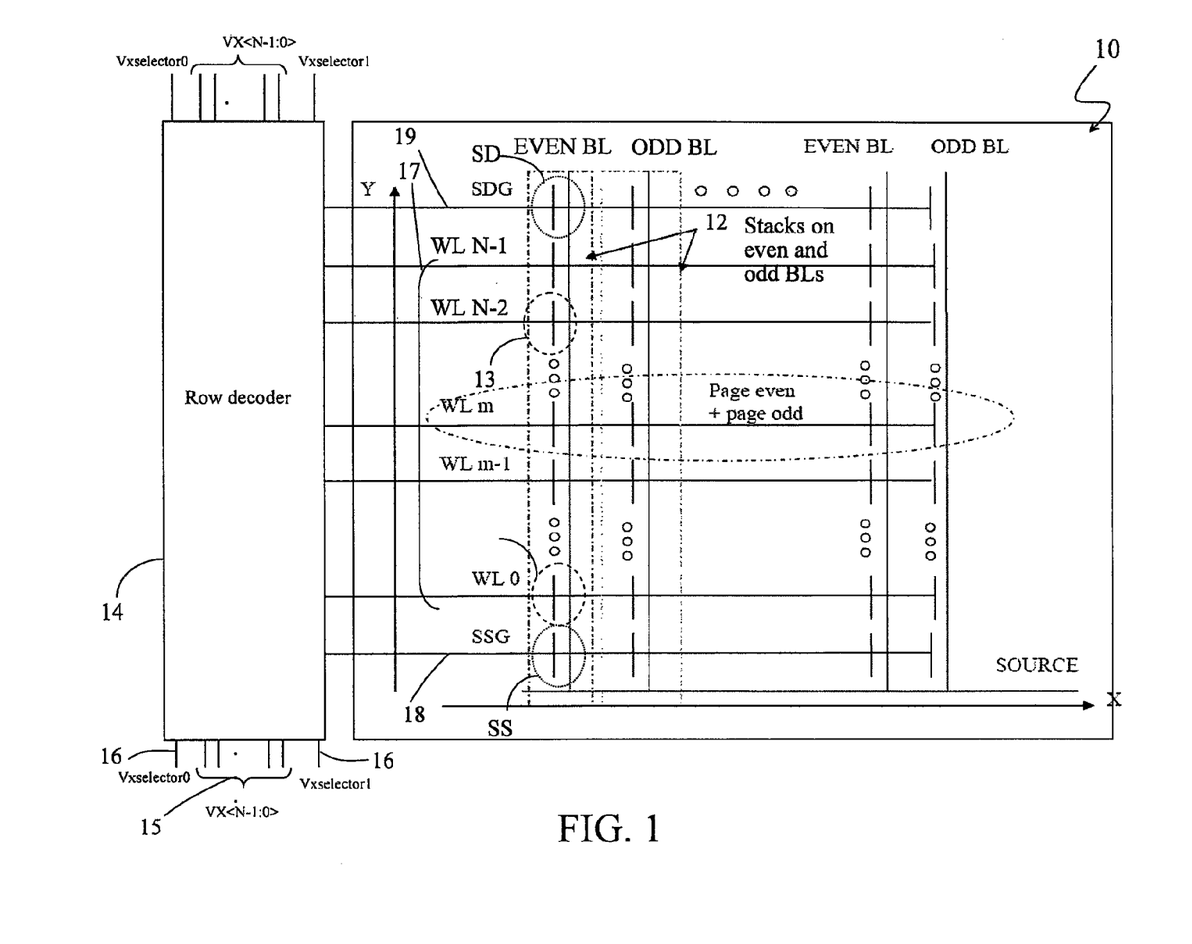

The present disclosure makes reference to a NAND memory device, usually comprising more memory array units which, together with their dedicated circuitries, are denominated planes. Each plane includes a plurality of blocks, one of which is shown in FIG. 1 as 10. The block 10 is connected to a row decoder 14 and comprises a plurality of stacks 12. The stack 12 includes a plurality of the memory cells 13 connected in series to each other, and the control gate of each cell is connected to an associated one of word lines 17, WL0 . . . WLN−1. The memory cell may be constituted by a floating-gate type transistor or a charge-trapping type transistor. Each stack 12 further includes selector cells SD and SS controlled by selector lines 18, 19 driven by the row decoder 14. The row decoder 14 is also connected to lines VX<N−1:0> 15 and to lines VX selector <1:0> 16. Each of the lines VX<N−1:0> serves as a selection/non-selection voltage receiving line and each of the lines VX selector <1:0> 16 serves as a selector selecting/unselecting voltage receiving line.

The row decoder 14 connects each of the word lines 17 WL0 . . . WLN−1 respectively to an associated one of the lines VX<N−1:0> 15, such as the line VX 0 to the word line 0, the line VX 1 to the word line 1 . . . , and the line VX N−1 to the word line N−1, through decoding circuit (not shown) responsive to address information. The row decoder 14 connects each of the selector lines 18 and 19 respectively to an associated one of the lines VX selector<1:0> 16, such as the line VX selector 0 to the selector line 18 and the line VX selector 1 to the selector line 19, also through decoding circuit (not shown) responsive to address information.

The first selector cell SS is constituted by a floating-gate type or charge-trap type transistor cell being rendered conductive to connect electrically a source line to the stack of the memory cells. A control gate of the first selector cell SS is connected to the selector lines 18 indicated as SSG.

The second selector cell SD is constituted by a floating-gate type or charge-trap type transistor cell being rendered conductive to connect electrically a bit line to the stack of the memory cells. A control gate of the second selector cell SD is connected to the selector lines 19 indicated as SDG.

A multiplicity of stacks 12 is connected to a same bit line BL on Y axis and the structure is then repeated on X axis to reach the full page size, which is the portion of the memory array 10 being addressed at a time for reading and program operations. The X and Y axis are conventionally disposed as the word lines WL 17 and the bit lines BL of the memory array 10, respectively, as shown in FIG. 1. In particular, the word lines WL along the X axis connect the gate terminals of the memory cells 13 belonging to different bit lines BL.

As a result, a memory array 10 is divided in a number M of blocks, each including a plurality of stacks 12, namely one stack for each bit line BL. Even and odd bit lines BL are separately addressed and belong to different pages, but a page always comprises cells 13 connected by a same word line WL. In other words, a page of the memory array 10 comprises cells belonging to a same word line WL and to different bit lines BL, in particular even or odd bit lines, as shown in FIG. 1.

More particularly, blocks are addressed selectively, each block representing a minimum number of memory cells 13 which are biased for each user mode operation. A user mode operation is performed on a single plane or in a parallel mode on more planes.

Since the voltage biasing values are different for selected and unselected word lines, NAND memory devices usually include at least two switches for each word line WL of a block. In particular, a first switch in the WL path is used to select the biasing voltage that will be delivered to a word line WL when it is selected and a second switch in the WL path is used to select the biasing voltage that will be delivered to the word line WL when it is unselected. It is thus clear that, if a block contains N word lines WL, the related word line path circuitry contains N switches for the selected word line voltage and N switches for the unselected word line voltage. These biasing voltages are then delivered only to a selected block by a so-called row decoder circuitry. For instance, in a program operation of the NAND memory cells, the selected word line voltage may be about 20 V, while the unselected word line voltage may be about 8 V.

Figure 2:
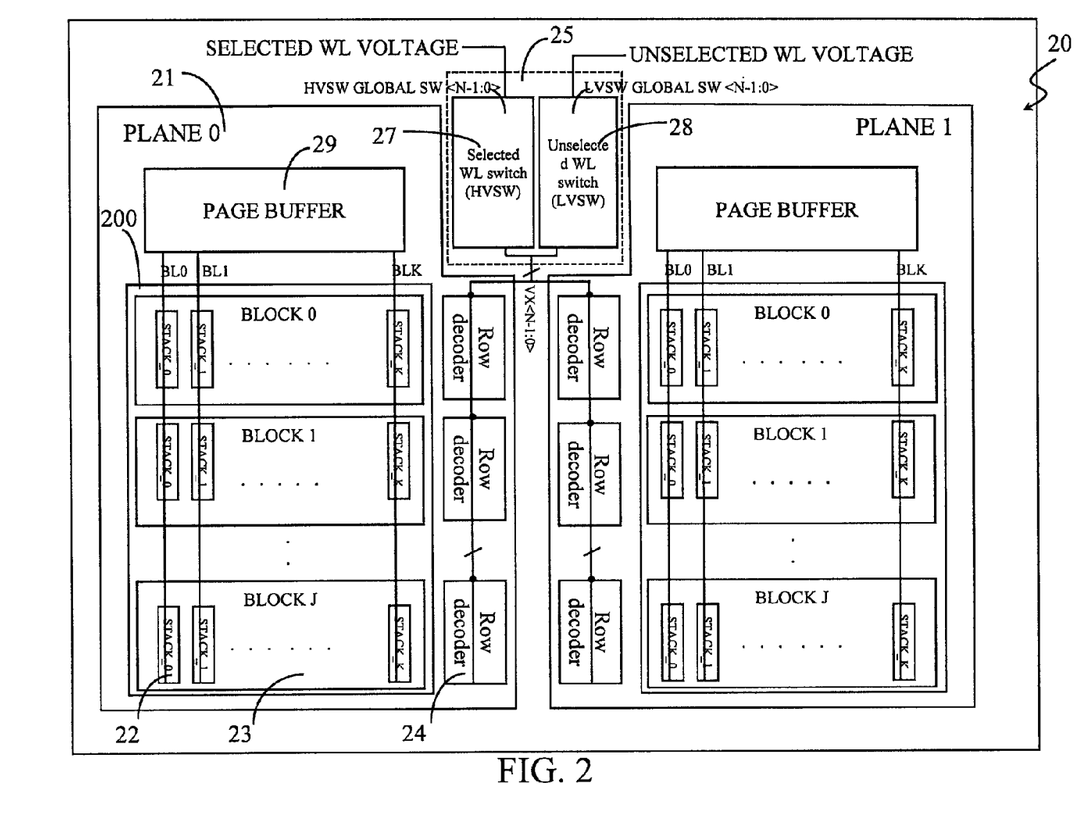
FIG. 2 schematically shows a memory device with multiple planes according to an embodiment of the invention.

A memory device with multiple planes is shown for sake of illustration in FIG. 2 as an embodiment of the present invention. In particular, FIG. 2 shows, only by way of a non limiting example, a memory device 20 comprising two planes 21, a first plane being also indicated as Plane 0 and a second plane being also indicated as Plane 1.

A plane 21 of each plane in turn comprises a memory array 200 comprising a plurality of blocks 23, also indicated as Block 0-Block J, in turn including a plurality of stacks 22, also indicated as Stack_0-Stack_K, corresponding stacks 22 in different blocks 23 being connected to a same bit line BL. In particular, the stacks labelled Stack_0 of all blocks 23, Block 1-Block J, are connected to a same bit line BL0, the stacks labelled Stack_1 of all blocks 23, Block 1-Block J, are connected to a same bit line BL1 and so on.

The plane 21 also comprises a plurality of row decoders 24, each connected to an associated block 23, and an associated page buffer 29. It should be noted that the detailed construction of each block 23 is shown in FIG. 1.

In a memory device with multiple planes of the known type, not only the row decoder circuitry but also all the voltage switches for the Selected and Unselected WL voltages to be delivered to each row decoder circuitry to bias selected and unselected word lines in a selected block are replicated for each plane and enabled only in the selected plane or planes. Usually, the Selected WL voltage is to be delivered to a selected word line and the Unselected WL voltage is to be delivered to a plurality of unselected word lines.

According to an aspect of the disclosure, the memory device 20 shown in FIG. 2 also comprises a switching circuitry 25 that usually comprises a multiplicity of high voltage switches (HVSW), indicated as HVSW GLOBAL SW <N−1:0> or Selected WL switch block 27, being a first global switching block, and a multiplicity of low voltage switches (LVSW), indicated as LVSW GLOBAL SW <N−1:0> or Unselected WL switch block 28, being a second global switching block, being N the number of the word lines in each block of the memory device 20.

More particularly, the switching circuitry 25 receives a Selected WL voltage and an Unselected WL voltage as biasing voltages to be delivered to the selected word line and unselected word lines in the selected block. In particular, the switching circuitry 25 is connected to lines VX<N−1:0>, for providing a total of N biasing signals VX<i>, each biasing signal VX<i> being delivered to a corresponding word line in the selected block by means of the corresponding row decoder 24 of the planes 21.

The first global switching block 27 (of the high voltage type) is used for delivering the biasing voltage to be applied to the selected word line and the second global switching block 28 (of the low voltage type) is used for delivering the biasing voltage to be applied to the unselected word lines.

Thus, according to this aspect of the disclosure, the switches for both the selected word line and the unselected word lines are common to all the planes of the memory device with multiple plane and the path to a selected block is enabled in the selected plane or planes by the row decoders. The row decoders are selected on the basis of a complete address, which also comprises a selection for a memory plane.

A switching circuitry 25 of this type thus implies higher power consumption for single plane operations with respect to the case of a memory architecture with a single plane. In fact, the capacitive loads of the biasing lines VX<N−1:0> are heavy since they serve all the planes 21 in parallel.

In particular, each one of the lines VX<N−1:0> carrying the biasing signals VX<i> for a first plane (Plane 0) of the planes 21 is shorted to a corresponding line VX<N−1:0> for a second plane (Plane 1), so that the load for single plane operations is increased. In essence, the lines VX>N−1:0> are shorted two by two, a generic line VX<j>_0 for Plane 0 being shorted to the corresponding line VX<j>_1 for Plane 1. Since the lines VX<N−1:0> are driven through the switches of the switching circuitry 25 by a charge pump or a regulator powered by a charge pump, the power consumption is increased consequently. Moreover a charge pump drop could happen on load connection event and the pump recovery time to normal value could affect also timing performance of single plane operations.

Figure 2A:
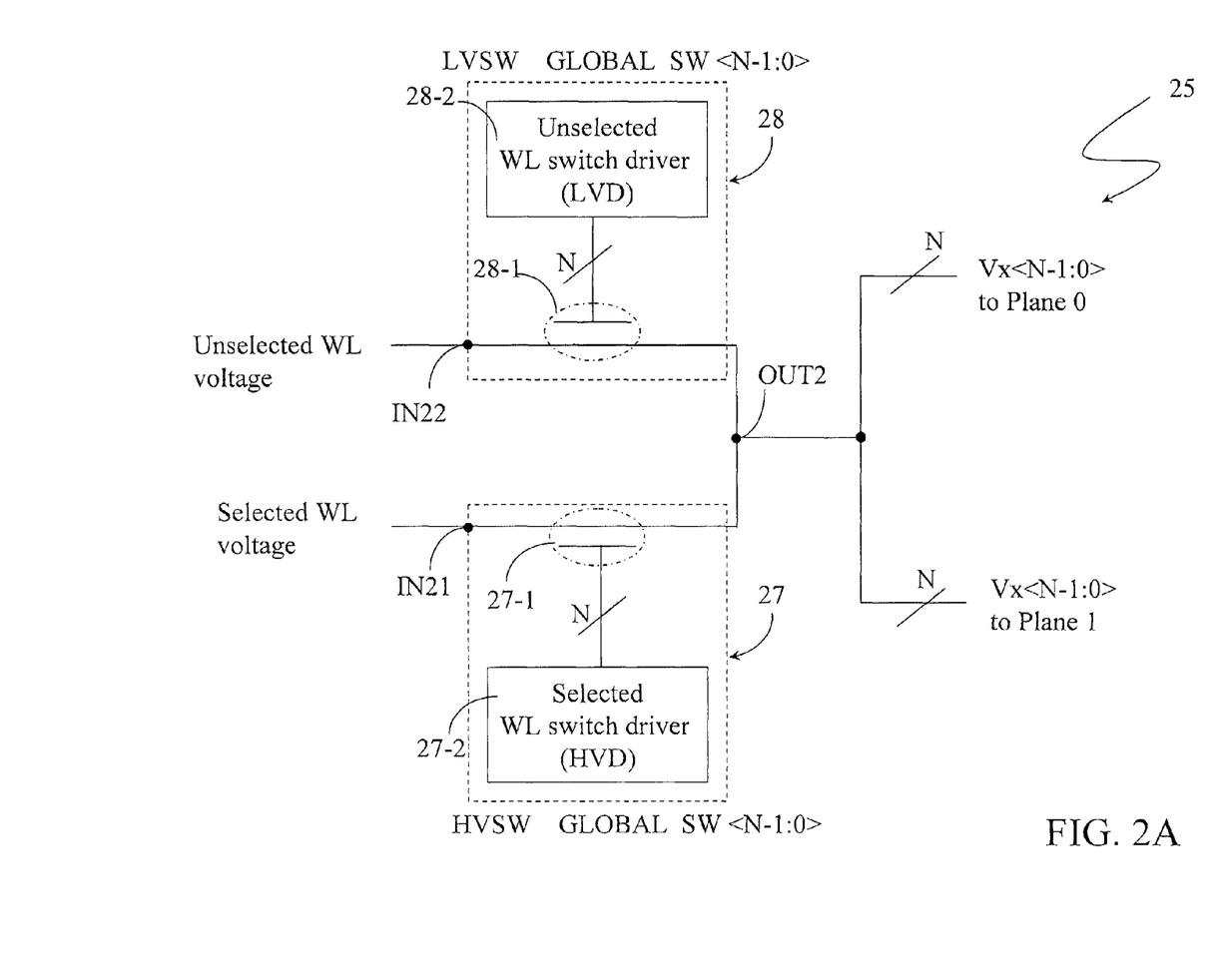
FIG. 2A schematically shows in more detail the switching circuits shown in FIG. 2.

FIG. 2A discloses the switching circuitry 25 shown in FIG. 2. The first global switching block 27 comprises N pieces of pass transistor 27-1 (only one transistor being shown) each connected between a node IN21 supplied with selected WL voltage and a node OUT2 connected to a corresponding one of the lines VX<N−1:0>. Each pass transistor 27-1 is controlled by an associated one of N pieces of selected WL switch driver 27-2 (only one being shown) to be turned ON (conductive) or OFF (non-conductive), the switch driver 27-2 being a High Voltage Type (HVD) driver. The second global switching block 28 comprises N pieces of pass transistor 28-1 (only one being shown) each connected between a node IN22 supplied with a unselected WL voltage and the node OUT2, and is controlled by an associated one of N pieces of unselected WL switch driver 28-2 (only one being shown) to be turned ON (conductive) or OFF (non-conductive), the switch driver 28-2 being a Low Voltage Type (LVD) driver. Thus, the global switching blocks 27 and 28 are provided in common to the first memory Plane 0 and the second memory Plane 1 such that both of the set of pass-transistors 27-1 for the selected WL voltage and the set of switch drivers 27-2 are provided in common to the first and second memory planes and both of the set of pass transistors 28-1 for the unselected WL voltage and the set of switch drivers 28-2 are provided in common to the first and second memory planes.

Figure 3:
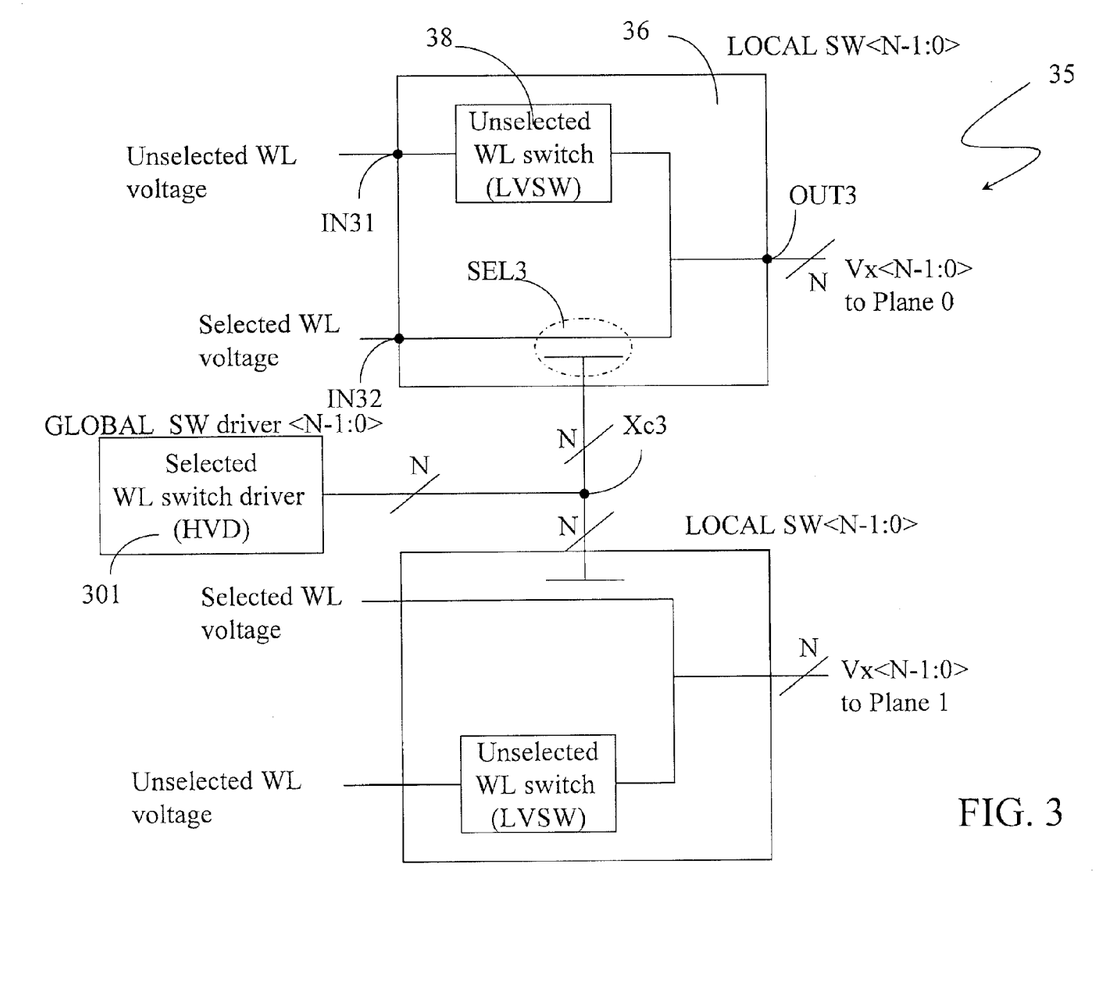
FIG. 3 schematically shows another embodiment of the invention indicative of a switching circuitry for a memory device with multiple planes being realized.

Turning to FIG. 3, a switching circuitry 35 according to another embodiment of the present invention is provided, which allows avoiding the replica of selected word line switches for each plane, without requiring a common path for unselected word lines.

More in particular, the switching circuitry 35 according to this embodiment comprises a plurality of local switching blocks, each local switching block 36, also indicated as LOCAL SW<N−1:0> in FIG. 3, being connected to one of the lines VX<N−1:0> that feed the row decoders of a single plane of a memory device with a multiple plane architecture according to the disclosure. The local switching block 36 in turn comprises an Unselect WL switch 38 being a low voltage switch (LVSW) used for delivering the biasing voltage to be applied to the unselected word lines. The Unselect WL switch 38 is inserted between a first input terminal IN31, which receives a Unselected WL voltage as biasing voltage, and an output terminal OUT3, connected to one of the lines VX<N−1:0> that feed the row decoders of a single plane. The local switching block 36 further comprises a local selector SEL3, being inserted between a second input terminal IN32, which receives a Selected WL voltage as biasing voltage, and the output terminal OUT3. The local selector SEL3 is a pass transistor or a pass circuitry or a switch. For example, the local selector SEL3 comprises a MOS transistor being inserted between the second input terminal IN32 and the output terminal OUT3 and having a control terminal, in particular a gate terminal, connected to a common node Xc3.

Figure 4:
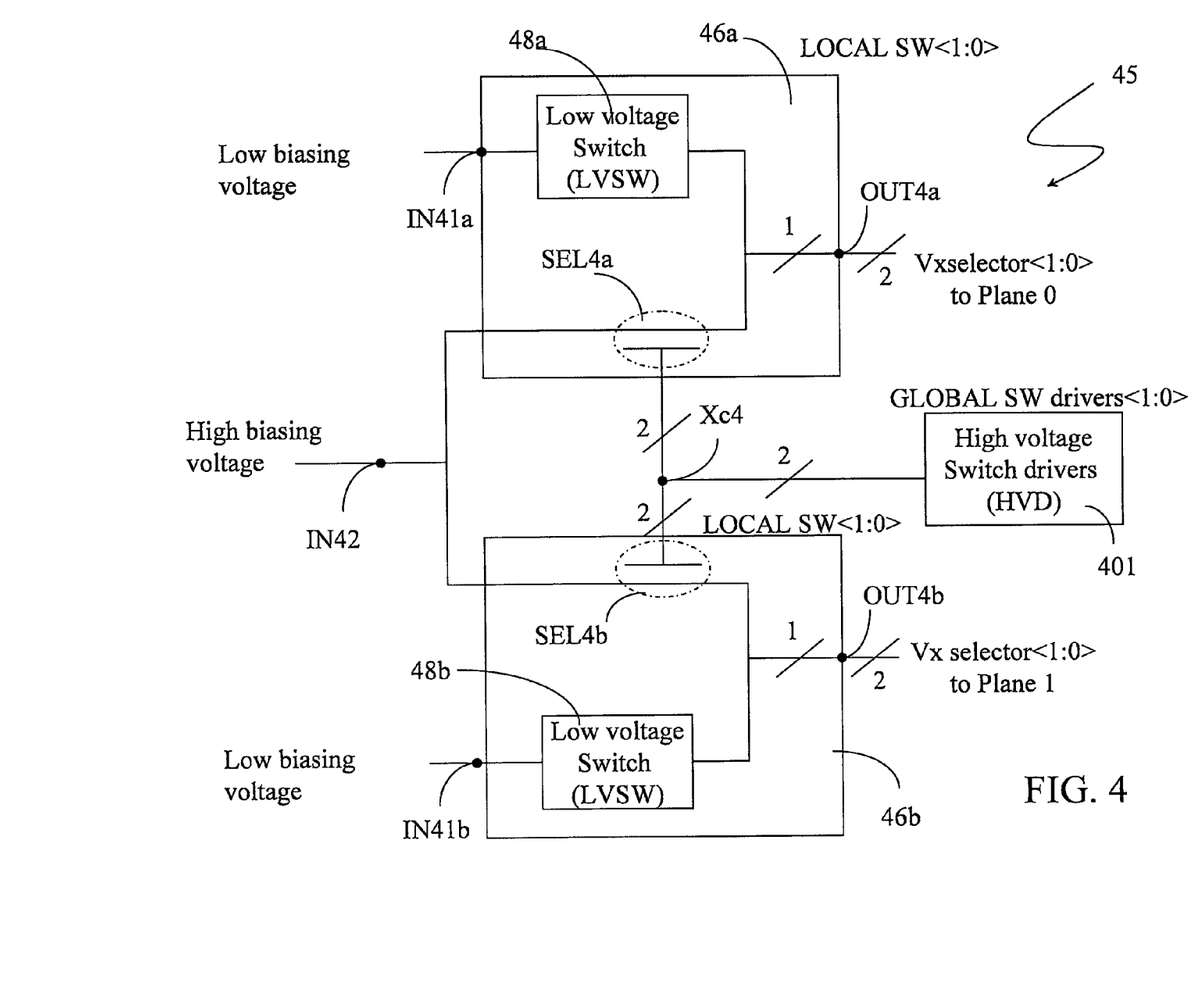
FIGS. 4 to 7 schematically show other embodiments of the invention indicative of a switching circuitry for a memory device with multiple planes being realized, respectively.

Moreover, the switching circuitry 35 comprises a global switch driver block 301, also indicated as GLOBAL SW driver <N−1:0> in FIG. 4, being a high voltage driver (HVD) block, in turn including a plurality of global switch drivers, the output of each global switch driver being connected to a common node Xc3. In particular, the global switch driver block 301 comprises N global switch drivers, N being the number of the word lines in a single block of the memory device. Each one of the plurality of common nodes Xc3 connects a pair of local selectors SEL3 inside two different local switch blocks 36, as shown in FIG. 3. Each one of the common nodes Xc3 is connected to the control terminal of the local selector SEL3 inside each one of the local switch blocks 36 of each plane, the local selector SEL3 then connecting the second input terminal IN32 to the output terminal OUT3, in turn connected to one of the lines VX<N−1:0> that feed each plane.

Figure 3A:
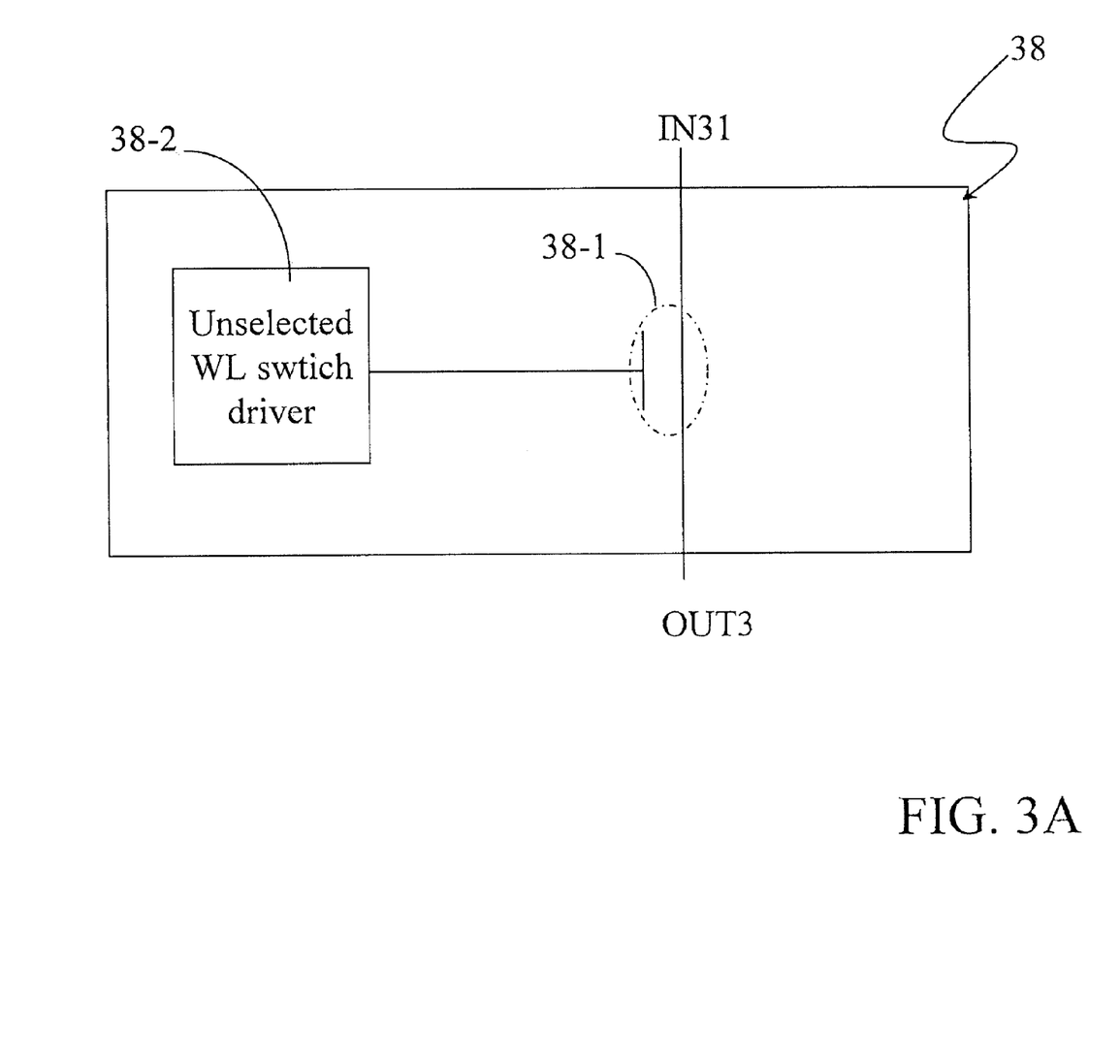
FIG. 3A schematically shows the Unselected WL switch shown in FIG. 3.

FIG. 3A discloses the Unselected WL switch 38 shown in FIG. 3. The Unselected WL switch 38 comprises a pass transistor 38-1 and a selected WL switch driver 38-2. The pass transistor 38-1 is coupled between the first input terminal IN31 and the output terminal OUT3. A control gate of the pass transistor 38-1 is connected to the unselected WL switch driver 38-2. The unselected WL switch driver 38-2 drives the pass transistor 38-1 to be ON (conductive) or OFF (non-conductive).

Turning back to FIG. 3, the global switches are split into the plurality of global switch drivers comprised into the global switch driver block 301 and a plurality of selectors SEL3, one for each local switch blocks 36, the second input terminal IN32 being the input terminal of the selector and the output terminal OUT3 being its output terminal. The Unselect WL switch 38 has been instead depicted, for sake of simplicity, as a single block and thus comprises its switch driver and its selector.

It is also known that high voltage switches (HVSW) can have an area occupation that is up to ten times the area occupation of low voltage switches (LVSW).

Referring to FIG. 3A, in case of a high voltage switch, the selector 38-1 occupies negligible area while the switch driver 38-2 comprises a high voltage circuitry and occupies a very huge area.

A memory architecture of the known type comprises a couple of switches for each word line in a block, for each plane. In particular, it comprises a switch for the selected word line of the high voltage type and a switch for the unselected word line of the low voltage type, with an area occupation ratio that can be of up to 10/1. So, such a known memory structure comprising N word lines per stack and k planes, shall include a total of k*N high voltage switches and a total of k*N low voltage switches.

Advantageously according to the embodiment of the switching circuitry 35 shown in FIG. 3, the total number of high voltage switch drivers is N (with a reduction of a factor k with respect to the known) while the total number of low voltage switches remains k*N. In addition, the memory architecture according to this embodiment of the disclosure also comprises k*N selectors, for instance very simple pass transistors, having negligible area occupation on silicon. In this way, the switching circuitry 35 allows to obtaining a great saving of area occupation, thus overcoming the main drawbacks still affecting the known memory structures.

It should be also emphasised that the switching circuitry 35 according to the present disclosure allows to decrease complexity of the memory device with multiple planes as a whole.

In particular, it should be remarked that the reduction of the number of high voltage switches not only lowers the required area, but also simplifies the routing of the switching circuitry 35 and reduce the current consumption during commutations, thus reducing the complexity of the memory device in terms of reduction of the difficulties tied to its silicon integration.

In a similar way, each one of the common nodes Xc3 could be connected to k local selectors SEL3 inside k different local switch blocks 36, being k the number of planes and N the number of cells in a stack of the planes of the memory device.

In essence, according to the embodiment of present disclosure shown in FIG. 3, a pair of the lines VX<N−1:0>, one for each memory planes of the memory device, as shown by way of illustration only in FIG. 3, are biased to the Selected WL voltage, while the remaining N−1 of said lines VX<N−1:0> on the selected plane are biased to the Unselected WL voltage. Obviously, the remaining N−1 of said lines VX<N−1:0> on the unselected plane are biased to ground (or left unselected).

Hence, according to this embodiment of the disclosure, the Unselect WL switches 38 for delivering the biasing voltage to be applied to the unselected word lines and the local selectors SEL3 in the local switching block 36 are replicated for each plane of the memory device, while the global switch drivers in the global switch driver block 301 are common for all planes. The row decoders enable the connection to the lines VX<−1:0> to the selected block in the selected plane (or planes, in case of multiple plane operations) and hence the delivering of the biasing voltages to be applied to the selected word line and unselected word lines of the selected block in the selected plane for single plane operation or the selected blocks in more planes for multiple plane operations.

In other words, the switching circuitry 35 comprises a first local switch being the local selector SEL3 coupled between a voltage line connected to second input terminal IN32 and providing the Selected WL voltage and the selection/non-selection voltage receiving line of a first plane of the memory device, corresponding to the line VX<N−1:0> to Plane 0 of FIG. 3. In particular, the first local switch is rendered conductive in response to a first control signal supplied to its first control node, connected to the common node Xc3.

In a similar manner, the switching circuitry 35 comprises a second local switch coupled between the voltage line connected to second input terminal IN32 and providing the Selected WL voltage and the selection/non-selection voltage receiving line of a second plane of the memory device, corresponding to the line VX<N−1:0> to Plane 1 of FIG. 3. In particular, the second local switch is rendered conductive in response to a second control signal supplied to its second control node, also connected to the common node Xc3.

Moreover, the global switch driver block 301 produces a switch signal at its output node, connected to the common node Xc3, a signal line extending from the output node of the global switch driver block and branching to reach the first control node of the first local switch and the second control node of the second local switch, the switch signal being transferred from the output node to the first and second control nodes as the first and second control signals.

As already explained, the switches for delivering the biasing voltage to be applied to the unselected word lines are usually much less critical than the switches for delivering the biasing voltage to be applied to the selected word line in terms of area occupation. The switching circuitry 35 according to this embodiment thus shows a substantial area reduction of the whole word line path switch circuitry and of the memory device as a whole.

Moreover the fact that only the selected word line path is common to all planes further allows power consumption saving in single plane operation.

The selected word line is, in fact, only one for each block and the path to the row decoders can be driven on more planes in parallel with a moderate power consumption. The unselected word lines path to the row decoders and its capacitive load, instead, is replicated N−1 times where N is the number of word lines in a block of the memory device, the biasing of these unselected word line paths concurrently for each memory plane of the memory device being no desirable. It should be remarked that according to this embodiment of the disclosure, only the switches that are less expensive in terms of area are replicated on more planes.

In order to fully understand the working of the switching circuitry 35 of FIG. 3, it has been considered the case in which one selected word line is biased at the Selected WL voltage by one of the local selectors SEL3, whose control terminal Xc3 is driven by one of the Selected WL switch of the global switch driver block 301 which is common to the planes and the (N−1) remaining unselected word lines are biased at the Unselected WL voltage by the (N−1) remaining Unselect WL switches 38, replicated on each plane. In this way, the lines VX<N−1:0> are not shorted two by two and shared among planes and the (N−1) lines among the lines VX<N−1:0> that are used to bias the unselected word lines can be driven independently.

Moreover, the global switch driver block 301 drives each one of the local selectors SEL3, in turn connected to one of the lines VX<N−1:0> of each plane. The line VX<i> for the selected word line is thus biased on all planes with a little increase on the load to be driven, since the additional contribution is reduced with respect to the case in which all the lines VX<N−1:0> are shared and shorted two by two among planes. In fact, being C the capacitive load of one of the lines VX<N−1:0>, according to the embodiment shown in FIG. 2, the total load to be driven is k*N*C, where k is the number of planes which are served in parallel by N lines VX<i> and N is the number of the cells in a stack. According to the embodiment shown in FIG. 3, the total capacitive load to be driven is instead equal to [k+(N−1)]*C, giving a factor (k+N−1)/kN of load reduction. For instance, in the case of k=2 planes, the load reduction is hence (N+1)/2N~1/2 for N of a typical memory structure (i.e. N=16 or more).

The lines VX<N−1:0> for the unselected word lines are driven separately and do not impact on the single plane operation performances of the memory device.

It is further remarked that the replica of the unselected word line switches does not deeply impact on area occupation, since this type of switches are simpler than the ones for the selected word lines, the latter being able to sustain very high voltages.

Another embodiment of the switching circuitry according to the present disclosure is shown in FIG. 4 for the exemplary case of a first and a second plane, Plane 0 and Plane 1, of a memory device. This embodiment in particularly relates to a switching circuitry for selecting a control or gate voltage to be applied to the selectors, SS and SD, for the source and drain terminals of the stacks 12, as shown in FIG. 1. The switching circuitry 45 comprises a first local switching block 46a, also indicated as LOCAL SW<1:0> in FIG. 4, having a first output terminal OUT4a being connected to a one of a first pair of lines VXselector<1:0> that feed the row decoders of the first plane, Plane 0 with the gate voltages, SSG and SDG, to be applied to the gate terminals of the selectors SS and SD for the source and drain terminals of the stacks 12 and comprising a Low voltage switch 48a being inserted between a first input terminal IN41a, which receives a low voltage as a first biasing voltage, and the first output terminal OUT4a. The first local switching block 46a further comprises a first local selector SEL4a, being inserted between a common input terminal IN42, which receives a high voltage as a second biasing voltage, and the first output terminal OUT4a and having a control terminal connected to a common node Xc4.

The switching circuitry 45 further comprises a second local switching block 46b having a second output terminal OUT4b being connected to one of a second pair of line VXselector<1:0> that feed the row decoders of the second plane, Plane 1, with the gate voltages, SSG and SDG, to be applied to the gate terminals of the selectors SS and SD for the source and drain terminals of the stacks 12 and comprising a Low voltage switch 48b being inserted between a second input terminal IN41b, which receives a low voltage as a first biasing voltage to be applied to the unselected word lines, and the second output terminal OUT4b. The second local switching block 46b also comprises a second local selector SEL4b, being inserted between the common input terminal IN42, which receives a high voltage as a second biasing voltage, and the second output terminal OUT4b and having a control terminal connected to the common node Xc4.

Moreover, the switching circuitry 45 comprises a global switch driver block 401, also indicated as GLOBAL SW drivers <1:0> in FIG. 4, being a high voltage driver (HVD) block, in turn including a pair of global switch drivers, the output of each global switch driver being connected to the common node Xc4 and thus to the selectors SEL4a and SEL4b. The Low voltage switches 48a and 48b have been depicted, for sake of simplicity, as single blocks and thus respectively comprise their switch drivers and their selectors.

Also according to this embodiment of the disclosure, the switching circuitry 45 allows to obtain a great saving of area occupation being the high voltage global switch driver block 401 in common and only the low voltage switches and the selector, whose impact on the occupation area is negligible with respect to the high voltage portion, being replicated for each plane.

Figure 5:
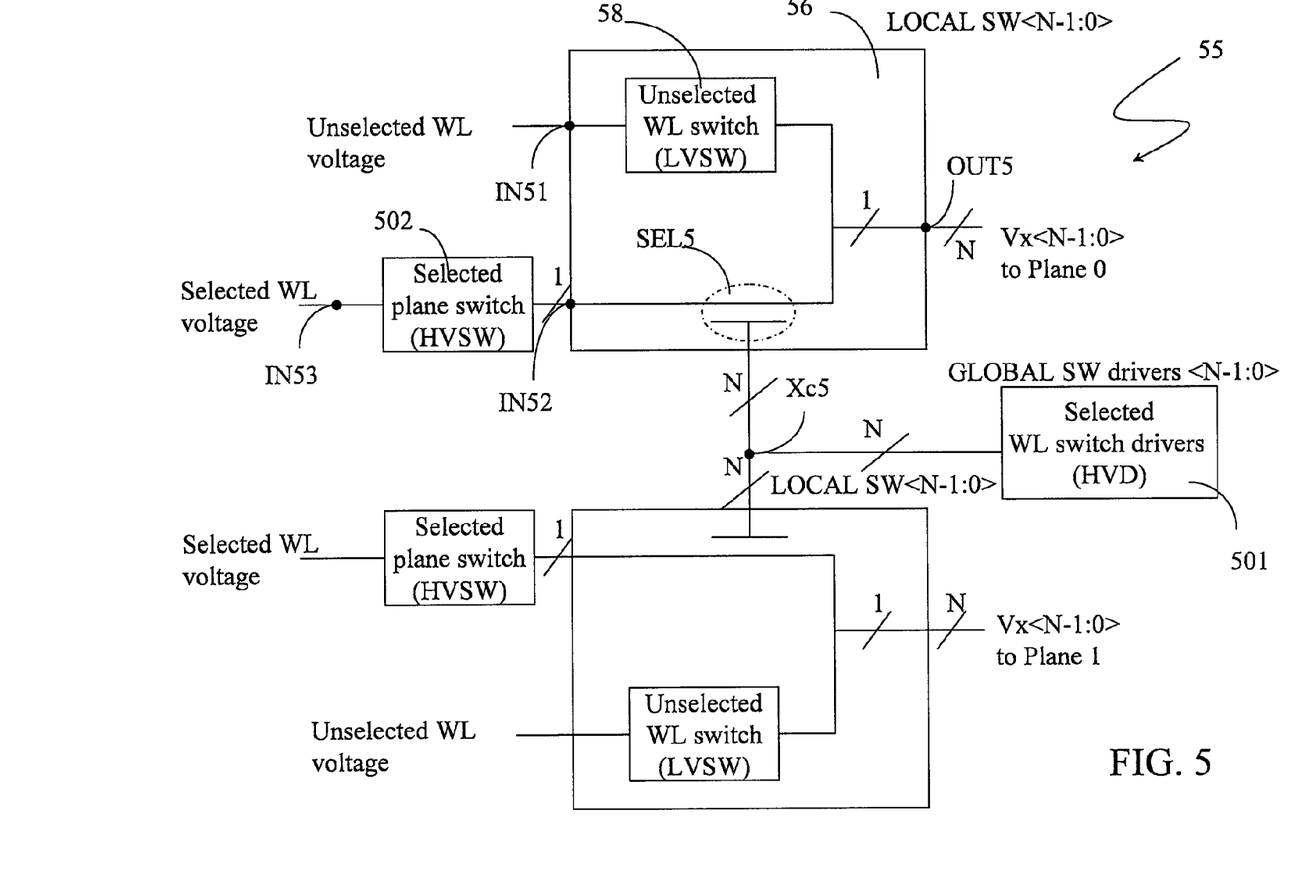

Another embodiment of the present disclosure is shown in FIG. 5. According to this embodiment the switching circuitry 55 comprises a plurality of local switching blocks, also indicated as LOCAL SW<N−1:0> in FIG. 5, each local switching block 56 being connected to a line VX<N−1:0> that feeds the row decoders of a single plane of a memory device with multiple plane architecture according to the disclosure. The local switching block 56 in turn comprises an Unselect WL switch 58 being a low voltage switch (LVSW) used for delivering the biasing voltage to be applied to the unselected word lines. The Unselect WL switch 58 is inserted between a first input terminal IN51, which receives an Unselected WL voltage as biasing voltage, and an output terminal OUT5, connected to the lines VX<N−1:0> of the first plane. The local switching block 56 further comprises a local selector SEL5, being inserted between a second input terminal IN52, and the output terminal OUT5. The local selector SEL5 is a pass transistor or a pass circuitry. For example, the local selector SEL5 comprises a MOS transistor being inserted between the second input terminal IN52 and the output terminal OUT5 and having a control terminal, in particular a gate terminal, connected to a common node Xc5. The Unselect WL switch 58 has been depicted, for sake of simplicity, as a single block and thus comprises its switch driver and its selector.

Moreover, the switching circuitry 55 comprises a global switch driver block 501, also indicated as GLOBAL SW driver <N−1:0> in FIG. 5, being a high voltage driver (HVD) block, in turn including a plurality of global switch drivers, the output of each global switch driver being connected to a common node Xc5 and thus to the selector SEL5. In particular, the global switch driver block 501 comprises N global switch drivers, N being the number of the word lines in a block of the memory device. Each one of the plurality of common nodes Xc5 connects a pair of local selectors SEL5 inside two different local switch blocks 56, as shown in FIG. 5.

The switching circuitry 55 further comprises a plurality of selected plane switches 502, being high voltage switches (HVSW), one for each plane of the memory device. The selected plane switch 502 of each plane is inserted between the second input terminals IN52 of all the local switching blocks 56 and a third input terminal IN53, which receives a Selected WL voltage as biasing voltage.

The switching circuitry 55 according to this further embodiment of the disclosure also allows to obtain a great saving of area occupation being the total number of high voltage switches being N (for the high voltage drivers of the global switch driver block 501)+k (for the selected plane switches 502), which is less than the total number N*k of high voltage switches of the known memory devices, being N usually equal to 32 or up and k equal to 2 or 4.

In particular, this embodiment of the disclosure further allows a selective biasing of selected word lines by selectively bias the corresponding biasing lines among the lines VX<N−1:0> only in the selected plane or planes. With reference to FIG. 5, which shows the case of two planes for sake of simplicity, the selected word line voltage is delivered to the local selector SEL5 inside each local switching block 56 controlled by the plurality of selected word line switch drivers 501 depending on a selection made by the selected plane switches 502. If a plane is selected the selected WL voltage is passed to input terminal IN52 of the local selector SEL5 through the selected plane switch 502. The local selector SEL5, whose control terminal is activated by the corresponding common node Xc5, in turn driven by one of the plurality of GLOBAL SW drivers <N−1>0>, connects the selected WL voltage at the input terminal IN52 to the line among the lines VX<N−1:0> connected to the output terminal OUT5. Finally, the row decoder in the selected plane, fed by the lines VX<N−1:0>, biases the selected word line at the selected WL voltage. In case a plane is not selected, the second input terminal of the local switching block 56 connected to the local selector SEL5 is grounded.

This embodiment further enhances the flexibility of a memory device comprising the described switching circuitry with the addition of only one switch for each plane, the above described selected plane switch 502. It allows biasing only the line VX<N−1:0> of a selected word line in the selected plane or planes.

Figure 6:
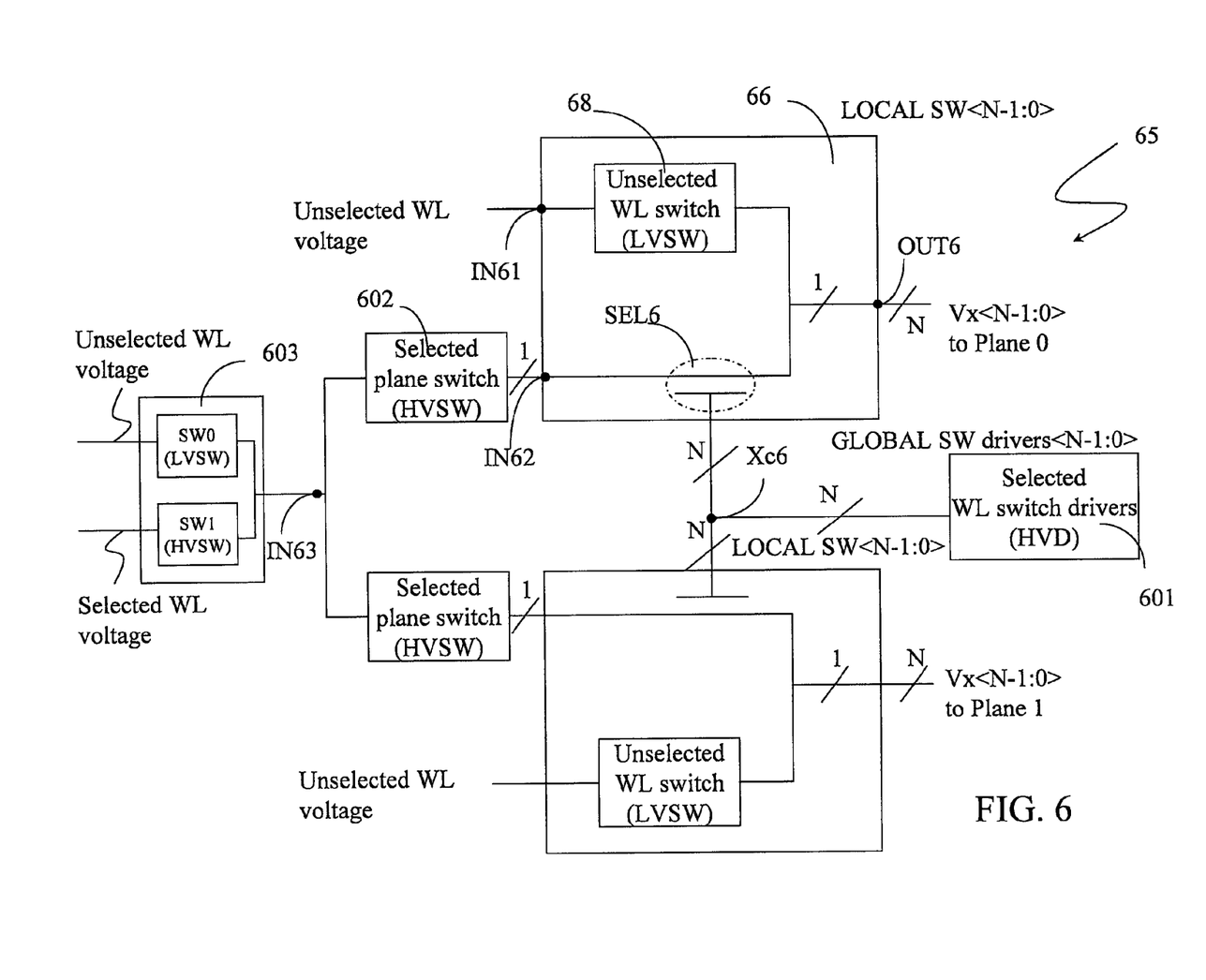

It should be remarked that the switching circuitry 55 according to the embodiment shown in FIG. 6 is able to select each of the planes respectively, for example, in first case of selecting both plane 0 and plane 1, second case of selecting one of the plane 0 and plane 1 and not selecting the other of the plane 0 and plane 1, and third case of not selecting both the plane 0 and plane 1. These selections of planes are obtained by the plane switches and thereby, in the above second case, the selected word line voltage is able to be supplied selectively to the selected one of the planes and not to be supplied to remaining one of the planes. In this connection, it is noted that the switching circuitry 35 according to the embodiment shown in FIG. 4 does not comprise the plane switches and does not select each of the planes respectively, and thereby selected word line voltage is supplied in common to every single of the planes, not to a selected one of the planes.

It is further possible to enhance the flexibility of the memory device as a whole by further adding an enabling switch connecting selected world line voltage path to unselected world line voltage path.

A further embodiment of the switching circuitry according to the disclosure is shown in FIG. 6, globally indicated as 65. The switching circuitry 65 comprises a plurality of local switching blocks, also indicated as LOCAL SW<N−1:0> in FIG. 6, each local switching block 66 being connected to a line VX<N−1:0> that feeds the row decoders of a plane of a memory device with multiple plane according to the disclosure. The local switching block 66 in turn comprises an Unselect WL switch 68 being a low voltage switch (LVSW) used for delivering the biasing voltage to be applied to the unselected word lines. The Unselect WL switch 68 is inserted between a first input terminal IN61, which receives an Unselected WL voltage as biasing voltage, and an output terminal OUT6, connected to one of the lines VX<N−1:0>. The local switching block 66 further comprises a local selector SEL6, being inserted between a second input terminal IN62, and the output terminal OUT6 and having a control terminal connected to a common node Xc6. The Unselect WL switch 68 has been depicted, for sake of simplicity, as a single block and thus comprises its switch driver and its selector.

Moreover, the switching circuitry 65 comprises a global switch driver block 601, also indicated as GLOBAL SW drivers <N−1:0> in FIG. 6, in turn including a plurality of global switch drivers, in particular N global switch drivers, N being the number of the word lines, the output of each global switch driver being connected to a common node Xc6. Each one of the plurality of common nodes Xc6 connects a pair of local selectors SEL6 inside two different local switch blocks 66.

In the example shown in FIG. 6, the switching circuitry 65 further comprises a plurality of selected plane switches 602, being high voltage switches (HVSW), one for each plane of the memory device. The selected plane switch 602 of each plane is inserted between the second input terminals IN62 of all the local switching block 66 and a third input terminal IN63, being common to all selected plane switches 602 of the local switch blocks 66.

The switching circuitry 65 also comprises a program switching block 603 being connected to the third common input terminal IN63 and receives an Unselected WL voltage and a Selected WL voltage as biasing voltages. The program switching block 603 comprises at least a first program switch SW0, being a low voltage switch (LVSW) used for delivering the Unselected WL voltage as biasing voltage to be applied to all the input terminals IN63 of the selected plane switches 602 and a second program switch SW1 being a high voltage switch (HVSW) used for delivering the Selected WL voltage as biasing voltage to be applied to all the input terminals IN63 of the selected plane switches 602.

In this way, the program switching block 603 can be used during a first step of the programming phase of the memory device to connect the selected and unselected word lines to the same biasing voltage, so as to raise all the word lines with a same rate.

This further embodiment is thus useful for example in program operation when all the word lines are biased in a first step of the programming phase to a same voltage, before raising the selected word line to a program voltage. This embodiment allows to bias all the word lines in a similar manner from a same voltage source, before disconnecting the selected word line from the others unselected word lines in order to rise such selected word line to the program voltage, in this way enhancing the flexibility of controlling the program algorithm of the memory device as a whole.

Also according to this further embodiment of the disclosure, the switching circuitry 65 allows to obtain a great saving of area occupation being the high voltage global switch driver block 601 in common and only the low voltage switches and the selector, whose impact on the occupation area is negligible with respect to the high voltage portion, being replicated for each plane. In this case, the high voltage switches added to the ones shown in FIG. 3, in particular the selected plane switches 602 and the second program switch SW1 of the program switching block 603, are not replicated N times but only k times at most (being N>>k).

Figure 7:
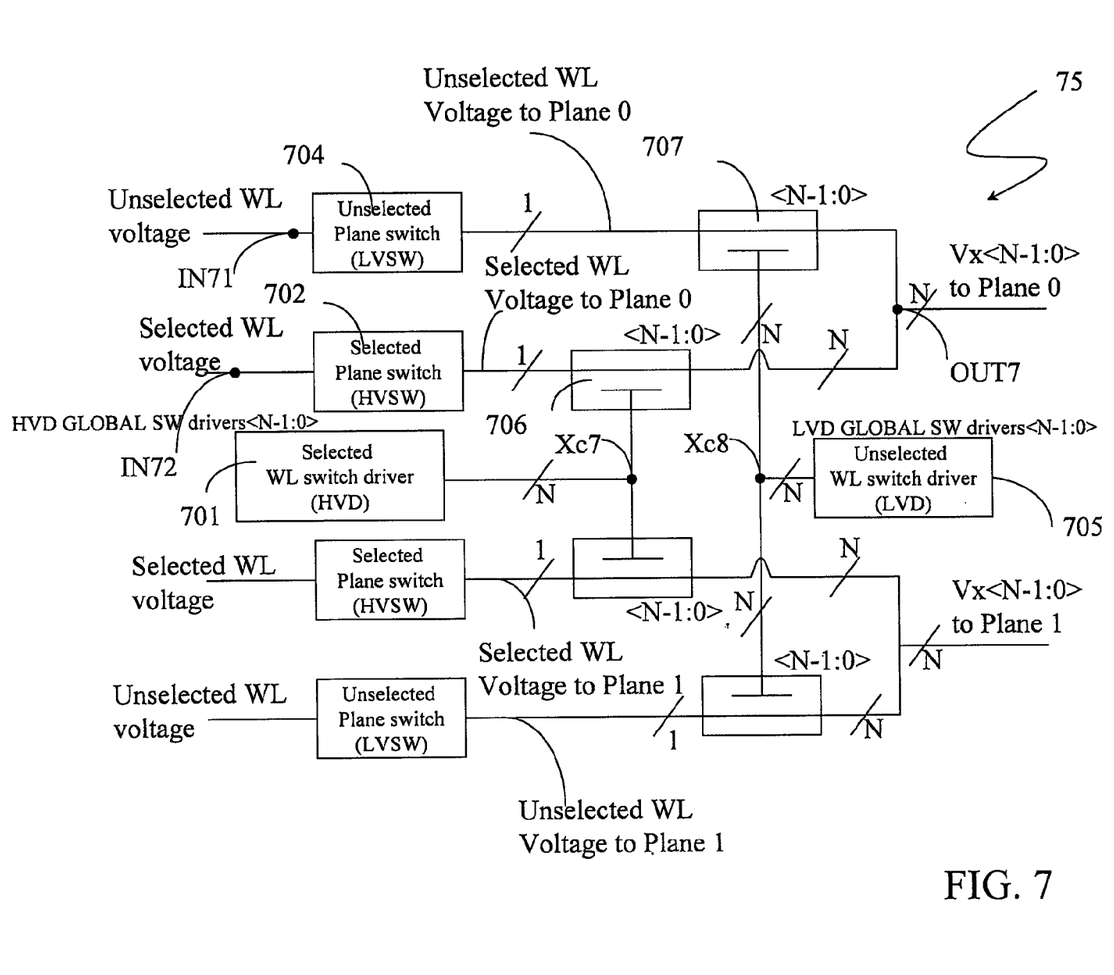

FIG. 7 shows yet another embodiment of the switching circuitry according to the present disclosure.

In particular, it should be noted that this embodiment allows a further area reduction for the switching circuitry 75 by replicating for the unselected word lines switches the configuration described in the other embodiments for selected word line switches.

The switching circuitry 75 comprises a first global switch driver block 701, also indicated as HVD GLOBAL SW drivers <N−1:0> in FIG. 7, being a high voltage driver (HVD) block and in turn including a plurality of first global switch drivers, the output of each global switch driver being connected to a common node Xc7. In particular, the first global switch driver block 701 comprises N first global switch drivers, N being the number of the word lines in a single block of the planes of the memory device.

The common node Xc7 is also connected to a first selection block 706 in turn including a plurality of first local selectors, the output of each first local selector being connected to an output terminal OUT7, in turn connected to a line VX<N−1:0> that feeds the row decoders of a plane of a memory device with multiple plane according to the disclosure.

The switching circuitry 75 further comprises a second global switch driver block 705, being a low voltage driver (LVD)

block, also indicated as LVD GLOBAL SW drivers <N−1:0> in FIG. 7. In particular, the second global switch driver block 705 comprises N second global switch drivers, N being the number of the word lines in a single block of the planes of the memory device, the output of each second global switch driver being connected to a common node Xc8.

The common node Xc8 is connected to a second selection block 707, in turn including a plurality of second local selectors, the output of each second local selector being connected to the output terminal OUT7.

It is thus remarked that, in FIG. 7, both the high voltage and the low voltage switches comprises a switch driver and a selector, respectively, the switch drive portions being in common and the selector being repeated for each plane of the memory device.

Moreover, the switching circuitry 75 comprises a plurality of first plane switches 704, being low voltage switches (LVSW), one for each plane of the memory device, in turn inserted between a first input terminal IN71, which receives an Unselected WL voltage as biasing voltage, and the second selection block 707 and a plurality of second plane switches 702, being high voltage switches (HVSW), one for each plane of the memory device, in turn inserted between a second input terminal IN72, which receives a Selected WL voltage as biasing voltage and the first selection block 706.

According to this further embodiment, the plane selection in provided by the first and second plane switches, which bias to a corresponding bias voltage only the lines for selected planes.

In particular, selected and unselected word line paths are grounded on unselected planes, so that even if the switches connecting them to the word lines are activated, the lines VX<N−1:0> and the word lines of the unselected planes are not biased by corresponding voltage regulators. The selected plane lines are instead connected to the voltage regulators, thus delivering a correct biasing voltage value to the selected plane or planes.

In this way a complete decoding of the selected and unselected word lines is obtained according to this further embodiment of the switching circuitry according to the disclosure.

According to this further embodiment of the disclosure, the switching circuitry 75 allows to obtain a great saving of area occupation being the switch driver portions of the high voltage and low voltage switches in common and only the selectors, whose impact on the occupation area is negligible with respect to the switch driver portion, being replicated for each plane. In this case, the high voltage switches added to the ones shown in FIG. 3, in particular the high voltage selected plane switches 702, are not replicated N times but only k times at most (being N>>k)

In essence, according to the embodiments of the present disclosure, the replica for each plane of a memory device with multiple planes of all the switches which deliver the x-path biasing to the row decoders is avoided. In particular, this replica of switches is done or not depending on the correct trade off between area occupation and power consumption. More in particular, the replica is independently evaluated for each switch biasing a path for selected word lines, unselected word lines or stacks selectors and, in case more switches are provided to bias the same path in different operations, also their replica is done independently.

Another embodiment of the present disclosure is directed to a method comprising:
    accessing a memory device, the memory device comprising,
        first and second planes each including a plurality of word lines connected to row decoders and a plurality of memory cells,
        a plurality of first local switches each provided to deliver, when selected, a first voltage to a line that feeds the row decoders of an associated one of the word lines of the first plane, and
        a plurality of second local switches each provided to deliver, when selected, the first voltage to a line that feeds the row decoders of an associated one of the word lines of the second plane; and
    producing a set of selection signals in response to the accessing, each of the selection signals being supplied in common to an associated one of the first local switches and an associated one of the second local switches to select the associated ones of the first and second local switches, and one of the selection signals taking an active level to select the associated ones of the first and second local switches and remaining one or ones of the selection signals taking an inactive level to unselect remaining one or ones of the first and second local switches.

The method may also comprise producing a control signal in response to the accessing to connect selected word line paths to unselected word line paths during a programming algorithm.

In this way, a selected word line path may be connected to an unselected word line path in order to obtain identical transients of a step of a programming algorithm.

In particular, this connecting step is performed by the switching circuitry described with reference FIG. 6.

In other words, the method provides for driving the lines VX<N−1:0> that feeds the row decoders of a plane of a memory device with multiple plane by:
    commonly driving the lines among the lines VX<N−1:0> that feed the row decoders of selected and unselected planes that are used to carry the biasing for the selected word line; and
    independently driving the lines among the lines VX<N−1:0> of selected plane or planes that are used to carry the biasing for the unselected word lines.

In this way, the lines among the lines VX<N−1:0> that feed the row decoders for the selected word line biasing of selected and unselected planes are concurrently biased to the Selected WL voltage for while the lines VX<N−1:0> that feeds the row decoders of the selected plane or planes are selectively biased to the Unselected WL voltage.

The word line paths of the selected plane or planes may be biased to the Unselected WL voltage and Selected WL voltage as biasing voltages and the word line paths of the unselected planes may be grounded.

In particular, the biasing is performed by a same switching circuitry, as the switching circuitry described with reference FIG. 7, thus realising a plane decoding before a word line decoding.

Finally, the method may also drive the lines that feeds the row decoders of a plane of a memory device with multiple plane switching circuitry and providing biasing voltages to be applied to the word lines in a single block of the memory device, by commonly driving the lines that feeds the row decoders of all planes.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:
1. A device comprising:
   first and second memory planes each comprising at least one selection/non-selection voltage receiving line, at least one word line operatively coupled to the selection/non-selection voltage receiving line, and a plurality of memory cells coupled to the word line;
   a selection voltage source line; and
   a selection voltage supply circuit comprising a first switch circuit and a first driver circuit driving the first switch circuit to be turned ON or OFF, the first switch circuit including a first node coupled to the selection voltage source line, a second node coupled to the selection/non-selection voltage receiving line of the first memory plane and a third node coupled to the selection/non-selection voltage receiving line of the second memory plane, and the first driver circuit being provided in common to the first and second memory planes.
2. The device as claimed in claim 1, wherein the first switch circuit includes a first switch transistor including a first main electrode connected to the first node, a second main node connected in common to the second and third nodes, and a control electrode connected to the first driver circuit.
3. The device as claimed in claim 1, further comprising:
   a non-selection voltage source line; and
   a non-selection voltage supply circuit comprising a second switch circuit and a second driver circuit driving the switch circuit to be turned ON or OFF, the second switch circuit including a fourth node coupled to the non-selection voltage source line, a fifth node coupled to the selection/non-selection voltage receiving line of the first memory plane and a sixth node coupled to the selection/non-selection voltage receiving line of the second memory plane, and the second driver circuit being provided in common to the first and second memory planes.
4. The device as claimed in claim 3, wherein the first switch circuit includes a first switch transistor including a first main electrode connected to the first node, a second main node connected in common to the second and third nodes, and a control electrode connected to the first driver circuit, and the second switch circuit includes a second switch transistor including a first main electrode connected to the fourth node, a second main node connected in common to the fifth and sixth nodes, and a control electrode connected to the second driver circuit.
5. The device as claimed in claim 1, wherein the first switch circuit includes first and second switch transistors, the first switch transistor including a first main electrode connected to the first node, a second main node connected to the second node, and a control electrode connected to the first driver circuit, and the second switch transistor including a first main electrode connected to the first node, a second main node connected the third node, and a control electrode connected to the first driver circuit.
6. The device as claimed in claim 5, wherein the selection voltage supply circuit further comprises first and second plane switches, the first plane switch being inserted between the first node of the first switch circuit and the first main electrode of the first switch transistor, and the second plane switch being inserted between the first node of the second switch circuit and the first main electrode of the second switch transistor.
7. A device comprising:
   first and second planes each including at least one selection/non-selection voltage receiving line, at least one word line operatively coupled to the selection/non-selection voltage receiving line, and a plurality of memory cells coupled to the word line;
   a first voltage line;
   a first local switch coupled between the first voltage line and the selection/non-selection voltage receiving line of the first plane, the first local switch being rendered conductive in response to a first control signal supplied to a first control node thereof;
   a second local switch coupled between the first voltage line and the selection/non-selection voltage receiving line of the second plane, the second local switch being rendered conductive in response to a second control signal supplied to a second control node thereof;
   a first global switch driver producing a first switch signal at an output node thereof; and
   a signal line extending from the output node of the first global switch driver and branching to reach the first control node of the first local switch and the second control node of the second local switch, the first switch signal being transferred from the output node to the first and second control nodes as the first and second control signals.
8. The device of claim 7, wherein each of the first and second planes further includes at least one selector selecting/unselecting voltage receiving line, at least one selector line operatively coupled to the selector selecting/unselecting voltage receiving line, and a selector cell coupled to the selector line;
   and the device further comprising:
   a selector voltage line;
   a first local selector switch coupled between the selector voltage line and the selector selecting/unselecting voltage receiving line of the first plane, the first local sector switch being rendered conductive in response to a first selector signal supplied to a first selector control node thereof;
   a second local selector switch couple between the selector voltage line and the selector selecting/unselecting voltage receiving line of the second plane, the second local selector switch being rendered conductive in response to a second selector signal supplied to a second selector control node thereof;
   a global selector switch driver producing a selector switch signal at an output thereof; and
   a selector signal line extending from the output node of the global selector switch driver and branching to reach the first selector control node of the first local selector switch and the second selector control node of the second local selector switch, the selector switch signal being transferred from the output of the global selector switch driver to the first and the second selector control nodes as the first and the second control signals.
9. The device of claim 7, further comprising:
   a second voltage line;
   a third local switch coupled between the second voltage line and the selection/non-selection voltage receiving line of the first plane, the third local switch being rendered conductive in response to a third control signal supplied to a third control node thereof;
   a first switch driver connected to the third control node of the third local switch and producing the third control signal to the third control node of the third local switch;
   a fourth local switch coupled between the second voltage line and the selection/non-selection voltage receiving line of the second plane, the fourth local switch being rendered conductive in response to a fourth control signal supplied to a fourth control node thereof; and a second switch deriver connected to the fourth control node of the fourth local switch and producing the fourth control signal to the fourth control node of the fourth local switch.

10. The device of claim 9, wherein a first voltage supplied to the first voltage line is higher than a second voltage supplied to the second voltage line, the first voltage being a voltage used for a word line selected in a program operation, and the second voltage being a voltage used for a word line unselected in the program operation.

11. The device of claim 7, further comprising:
a first plane switch inserted between the first voltage line and the first local switch,
a second plane switch inserted between the first voltage line and the second local switch.

12. The device of claim 11, further comprising:
a second voltage line;
a third local switch coupled between the second voltage line and the selection/non-selection voltage receiving line of the first plane, the third local switch being rendered conductive in response to a third control signal supplied to a third control node thereof;
a first switch driver connected to the third control node of the third local switch and producing the third control signal to the third control node of the third local switch;
a fourth local switch coupled between the second voltage line and the selection/non-selection voltage receiving line of the second plane, the fourth local switch being rendered conductive in response to a fourth control signal supplied to a fourth control node thereof; and
a second switch driver connected to the fourth control node of the fourth local switch and producing the fourth control signal to the fourth control node of the fourth local switch.

13. The device of claim 12, wherein a first voltage supplied to the first voltage line is higher than a second voltage supplied to the second voltage line, the first voltage being a voltage used for a word line selected in a program operation, and the second voltage being a voltage used for a word line unselected in the program operation.

14. The device of claim 7, further comprising:
a common node,
a first plane switch inserted between the common node and the first local switch,
a second plane switch inserted between the common node and the second local switch,
a first program switch inserted between the first voltage line and the common node; and
a second voltage line;
a second program switch inserted between the second voltage line and the common node.

15. The device of claim 14, wherein a first voltage supplied to the first voltage line is higher than a second voltage supplied to the second voltage line, the first voltage being a voltage used for a word line selected in a program operation, and the second voltage being a voltage used for a word line unselected in the program operation.

16. The device of claim 11, further comprising:
a second voltage line;
a third plane switch coupled between the second voltage line and a first internal node;
a third local switch coupled between the first internal node and the selection/non-selection voltage receiving line of the first plane, the third local switch being rendered conductive in response to a third control signal supplied to a third control node thereof;
a fourth plane switch inserted between the second voltage line and a second internal node;
a fourth local switch coupled between the second internal node and the selection/non-selection voltage receiving line of the second plane, the fourth local switch being rendered conductive in response to a fourth control signal supplied to a fourth control node thereof; and
a second global switch driver producing a second switch signal at an output node thereof;
a second signal line extending the output node of the second global switch and branching to reach the third control node of the third local switch and the fourth local node of the fourth local switch, the second switch signal being transferred from the output node to the third and the fourth control nodes as the third and the forth control signals.

17. The device of claim 16, wherein a first voltage supplied to the first voltage line is higher than a second voltage supplied to the second voltage line, the first voltage being a voltage used for a word line selected in a program operation, and the second voltage being a voltage used for a word line unselected in the program operation.

18. The device of claim 7, wherein each of the memory cells is a NAND type memory cell.

19. A method comprising:
accessing a memory device, the memory device comprising,
first and second planes each including a plurality of word lines connected to row decoders and a plurality of memory cells,
a plurality of first local switches each provided to deliver, when selected, a first voltage to a line that feeds the row decoders of an associated one of the word lines of the first plane, and
a plurality of second local switches each provided to deliver, when selected, the first voltage to a line that feeds the row decoders of an associated one of the word lines of the second plane; and
producing a set of selection signals in response to the accessing, each of the selection signals being supplied in common to an associated one of the first local switches and an associated one of the second local switches to select the associated ones of the first and second local switches, and one of the selection signals taking an active level to select the associated ones of the first and second local switches and remaining one or ones of the selection signals taking an inactive level to unselect remaining one or ones of the first and second local switches.

20. The method of claim 19, further comprising:
producing a control signal in response to the accessing to connect selected word line paths to unselected word line paths during a programming algorithm.

* * * * *